United States Patent [19]

Stevens

[11] Patent Number: 5,773,815
[45] Date of Patent: Jun. 30, 1998

[54] INTEGRATE-AND-DUMP RECEIVER FOR FIBER OPTIC TRANSMISSION

[75] Inventor: Andrew Evan Stevens, New York, N.Y.

[73] Assignee: International Business Machines Corporation, Armonk, N.Y.

[21] Appl. No.: 235,762

[22] Filed: Apr. 29, 1994

[51] Int. Cl.$^6$ ...................................................... H01J 40/14
[52] U.S. Cl. ............................... 250/214 A; 250/214 LA; 330/308
[58] Field of Search ........................ 250/214 A, 214 LA, 250/214 RC, 214 C, 214 AG; 330/308, 59; 307/311; 359/174, 194, 158, 189; 327/187

[56] References Cited

U.S. PATENT DOCUMENTS 5,343,160  8/1994  Taylor ..................................... 330/308
5,347,389  9/1994  Skrobko .................................... 330/59
5,369,350  11/1994  Matsuda .................................... 330/59

*Primary Examiner*—Edward P. Westin
*Assistant Examiner*—Que T. Le
*Attorney, Agent, or Firm*—Douglas W. Cameron

[57] ABSTRACT

A highly sensitive optical receiver where one terminal of the photodiode of the receiver is connected to a negatively biased amplifier while the other terminal of photodetector is connected to a positively biased amplifier, where such connections automatically bias the photodiode and use the current from both terminals (anode and cathode) of the photodiode. This invention also provides an optical receiver which has a DC cancellation circuit to eliminate the biasing voltages in the final output signal.

4 Claims, 6 Drawing Sheets

INTEGRATE-AND-DUMP RECEIVER FOR FIBER OPTIC TRANSMISSION

TECHNICAL FIELD

The invention relates to the field of optical/electronic transducers (photodetectors) and the reception of binary information from a signal light incident on such a photodetector. More specifically, it relates to the conversion of a small signal current at the output of a photodetector into a standard voltage level (e.g. TTL or ECL logic levels) for subsequent use in high-speed computer.

DESCRIPTION OF THE PRIOR ART

A low-noise receiver is necessary to interface a photodetector to a digital system. The following are several desirable features of the receiver:

- high signal-to-noise ratio (SNR) in order to maximize receiver sensitivity
- manufacturability in a silicon technology (e.g. CMOS) in order to minimize cost
- direct coupling of the photodetector to the input of the receiver in order to avoid external bias circuits and ac coupling capacitors for the photodetector.

It is well known in the prior art that an integrate-and-dump receiver theoretically provides optimum SNR, typically several dB better than other receiver designs. FIG. 1 shows an integrate-and-dump optical receiver. The cathode of the photodiode 81 is connected to the power supply, and the anode is connected to the inverting (−) terminal of an operational amplifier 82. The non-inverting (+) terminal of the operational amplifier is connected to ground. An integration capacitor 83 and reset switch 84 are connected in parallel between the output of the operational amplifier 82 and the inverting terminal of the operational amplifier 82. The output of the amplifier 82 is fed to the input of a flip flop 85.

The operational amplifier 82 is presumed to have high gain, and thus its inverting and non-inverting terminals will be at approximately the same potential. Thus, since the non-inverting terminal of the operational amplifier 82 is connected to ground potential, then the inverting terminal of operational amplifier 82 will also be at ground potential. This subsequently places a bias voltage of $V_{pp}$ across the photodiode 81 because its cathode is connected directly to $V_{pp}$ and its anode is connected to the inverting input of the operational amplifier 82, which is at ground potential.

The photodiode 81 generates an output current proportional to the amount of incident light on its surface. The operational amplifier is presumed to have high input impedance and high gain, and thus directs the output current of the photodiode 81 onto the left terminal of the integration capacitor 83. If the output current of the photodiode 81 maintains a constant value (corresponding to a binary "1"), then the output of the operational amplifier 82 will ramp down with a negative constant slope. This is depicted as waveform 92 in FIG. 2. If the output current of the photodiode is zero (corresponding to a binary "0"), then the output of the operational amplifier will remain unchanged. At the end of a specified bit period, the flip flop 85 samples the output of the operational amplifier 82 and decides whether a "1" (negative voltage value at output of operational amplifier 82) or "0" (zero voltage value at the output of operational amplifier 82) has been received. At this point, the reset switch 84 is closed and opened by the CLOCK signal 93 in order to reset the capacitor 83 to zero voltage initial conditions. The entire sequence is then repeated for the next bit.

One drawback of this method of biasing the photodiode 81 is limited sensitivity because the cathode current is shunted directly to the supply $V_{pp}$, and thus only the anode current of photodiode 81 is integrated by the operational amplifier 82. If both the cathode and anode currents of photodiode 81 could be used in the receiver, a more efficient and sensitive receiver could be obtained.

Another integrate-and-dump amplifier is disclosed in an article by Renuka P. Jindal in the *IEEE Journal of Lightwave Technology*, Vol. 8, No. 7, July 1990. In this article, a technique of improving receiver sensitivity is presented which uses an integrate-and-dump receiver and high speed clocks. U.S. Pat. No. 5,233,180 to Tsurata et al. discloses the use of a parallel arrangement of integrate-and-dump receivers, which are similar to the receivers shown in FIG. 1 of the current application. With this parallel combination, the integrate, dump and readout functions can be performed simultaneously to thereby reduce the need for high speed extremely narrow clock pulses. Tsurata, however, does not teach or suggest using both cathode and anode current from the photodiode. Also, as distinguished from one of the more narrow embodiments of the applicant's invention, Tsurata discloses the use of a photodiode for each integrate-and-dump receiver. In the more specific embodiment of the current application, only one photodetector is used for all of the integrate-and-dump receivers. In addition, there is no teaching or suggestion in Tsurata of a bias cancellation circuit as covered in some of the claims of the current application.

U.S. Pat. 5,252,820 to Shinomiya discloses the use of a single PSD photodetector connected to two integrating amplifiers. However, there is no teaching or suggestion of biasing the detector using both N-type and P-type integrators.

SUMMARY OF THE INVENTION

Accordingly, it is an object of this invention to provide a more sensitive optical receiver.

It is a more specific object of this invention to provide an optical receiver which utilizes both anode and cathode currents from the photodiode, while also keeping the diode under a fixed biased condition.

Accordingly, this invention is an optical receiver comprising a photodiode with one terminal being connected to a negatively biased electronic amplifier while the other terminal is connected to a positively biased second electronic amplifier, where the photodiode is biased as a result of the connections of the amplifiers to its terminals.

The term "connected" or "electronically connected" shall also refer to connection through a switch.

More specifically, this invention uses two operational amplifiers in parallel, with the inverting input of one of operational amplifiers being connected to the cathode of the photodiode while the inverting input of the second operational amplifier is connected to the anode of the photodiode. The non-inverting input of the first amplifier is maintained at a DC potential. If the operational amplifier is presumed to have high gain, then its inverting and non-inverting inputs will be maintained at approximately the same potential. Thus, the same DC voltage at the non-inverting input of the operational amplifier will appear as a bias voltage at the cathode of the photodetector. Likewise, the non-inverting input of the second operational amplifier is held at a DC potential which is lower than the potential at the non-inverting input of the first operational amplifier. This potential will then appear at the anode of the photodetector. Thus the photodetector will be biased with a voltage equal to the difference between the DC potentials held at the non-inverting terminals of the two operational amplifiers.

By biasing the photodetector in this fashion, two operational amplifiers are used, with each amplifier generating its own output voltage. In order to generate a single digital output bit stream, the two operational amplifier outputs are combined together by using a bias cancellation circuit. The purpose of such a bias cancellation circuit is to take the outputs of the two operational amplifiers, which are biased at different DC levels, and to combine the signals into a single balanced differential output voltage which is independent of the bias voltages. This conversion is desirable due to the noise rejection capabilities of balanced differential signals.

DESCRIPTION OF THE PREFERRED EMBODIMENT

Figure 1:
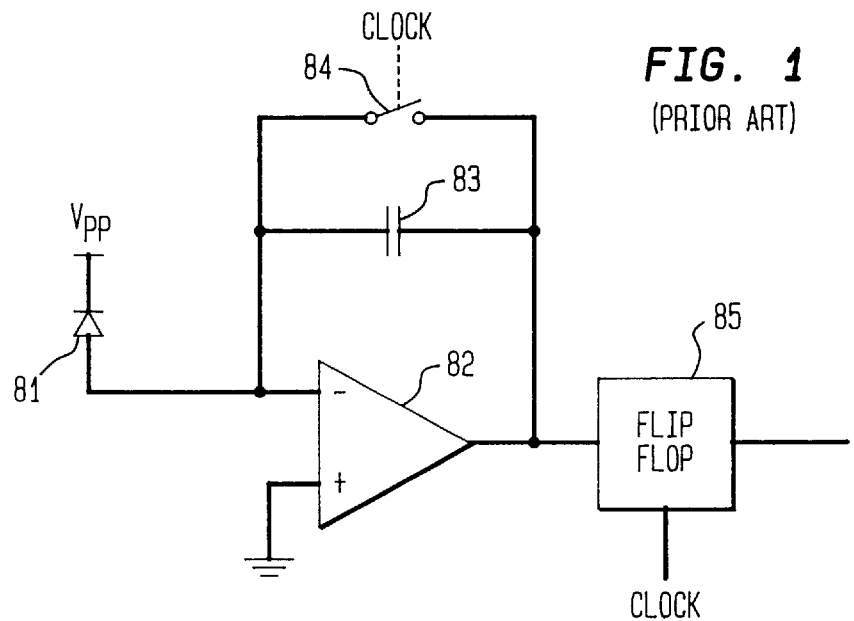
FIG. 1 is a circuit schematic of an integrate-and-dump optical receiver as known in the art.
Figure 2:
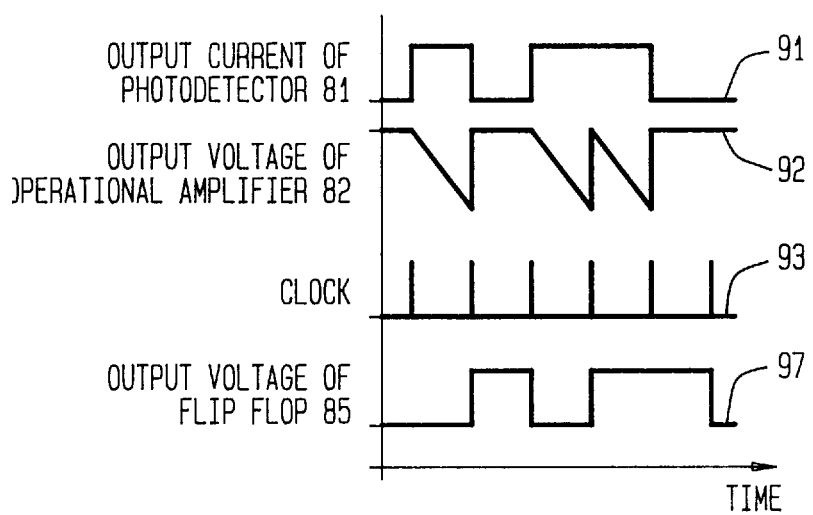
FIG. 2 is a timing diagram depicting the operation of the optical receiver in FIG. 1.
Figure 3:
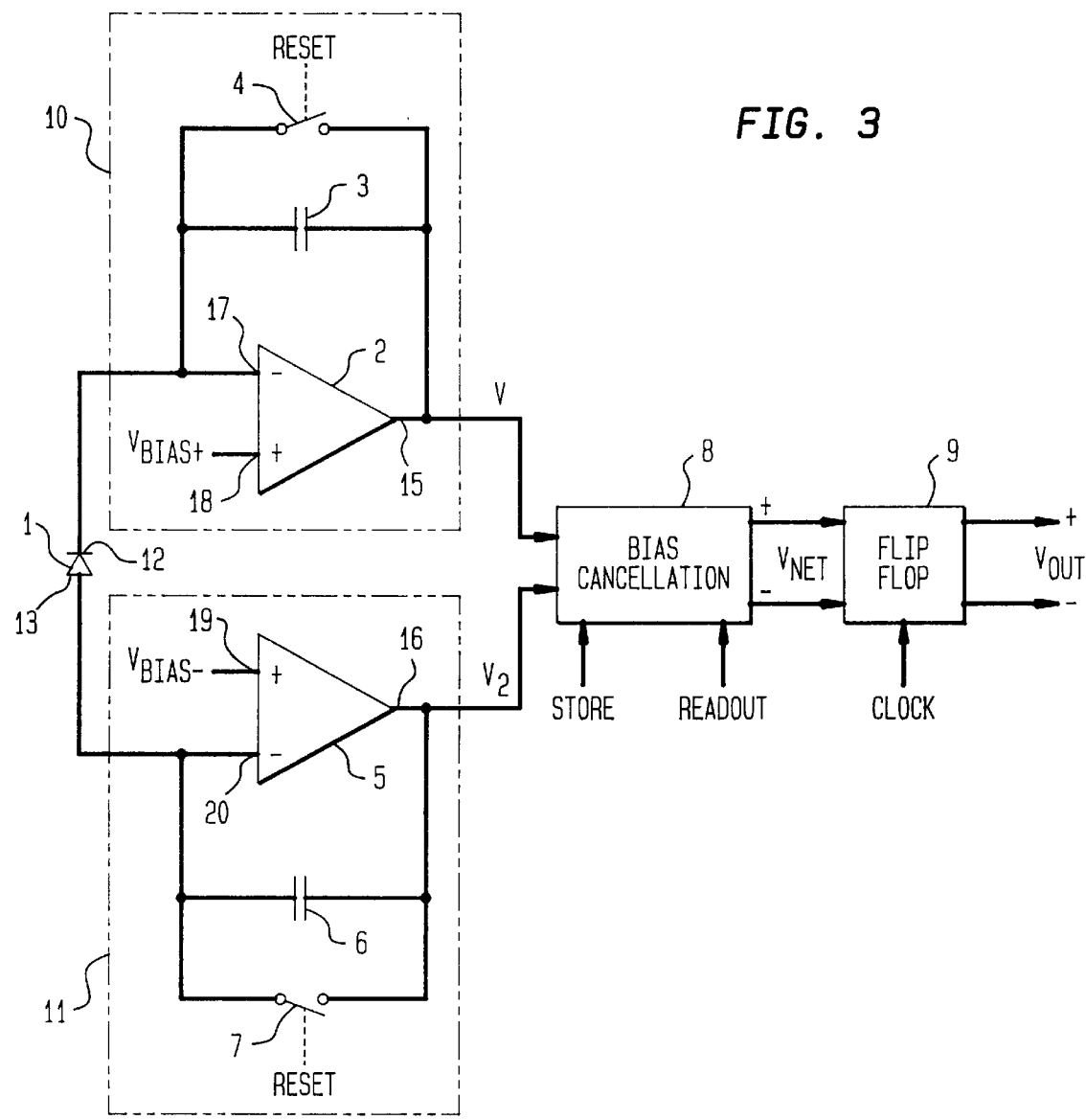
FIG. 3 is a circuit schematic showing an optical receiver whose photodiode is biased using two operational amplifiers.

FIG. 3 illustrates a schematic diagram of a circuit embodying the present invention for an integrate-and-dump optical receiver. The circuit consists of a photodiode 1 with its cathode 12 connected to the inverting input 17 of an operational amplifier 2, and its anode 13 connected to the inverting input 20 of a second operational amplifier 5. The first operational amplifier 2 has its noninverting input 18 connected to a DC biasing voltage $V_{bias+}$, while the second operational amplifier 5 has its non-inverting terminal 19 connected to a DC bias voltage $V_{bias-}$. An integration capacitor 3 and reset switch 4 are connected in parallel between the output 15 of operational amplifier 2 and the inverting input 17 of operational amplifier 2. Likewise, an identically-valued integration capacitor 6 and reset switch 7 are connected in parallel between the output 16 of operational amplifier 5 and the inverting terminal 20 of operational 5. The opening and closing of switch 4 and switch 7 is controlled by digital signal RESET. The combination of operational amplifier 2, capacitor 3, and switch 4 form an integrator 10. Likewise, the combination of operational amplifier 5, capacitor 6, and switch 7 form a second integrator 11. The output 15 of operational amplifier 2 and the output 16 of operational amplifier 5 are connected to the input of bias cancellation circuit 8. Bias cancellation circuit 8 is controlled by digital signals STORE and READOUT as explained below. The differential outputs of bias cancellation circuit 8 are connected to the inputs of flip flop 9. Flip flop 9 is loaded by digital signal CLOCK. The differential output of flip flop 9 is referred to as voltage $V_{out}$.

If operational amplifier 2 is presumed to have high gain, then its inverting and non-inverting inputs will be maintained approximately the same potential. Thus, the DC voltage $V_{bias+}$ which appears at the non-inverting input 18 of the operational amplifier 2 will appear as a bias voltage at the cathode 12 of the photodetector 1. Likewise, the DC voltage $V_{bias-}$ which appears at the noninverting input 19 of operational amplifier 5 will appear as a bias voltage at the anode 13 of the photodetector 1. Thus, the bias voltage applied across the photodetector 1 will be $V_{bias+}-V_{bias-}$.

Figure 4:
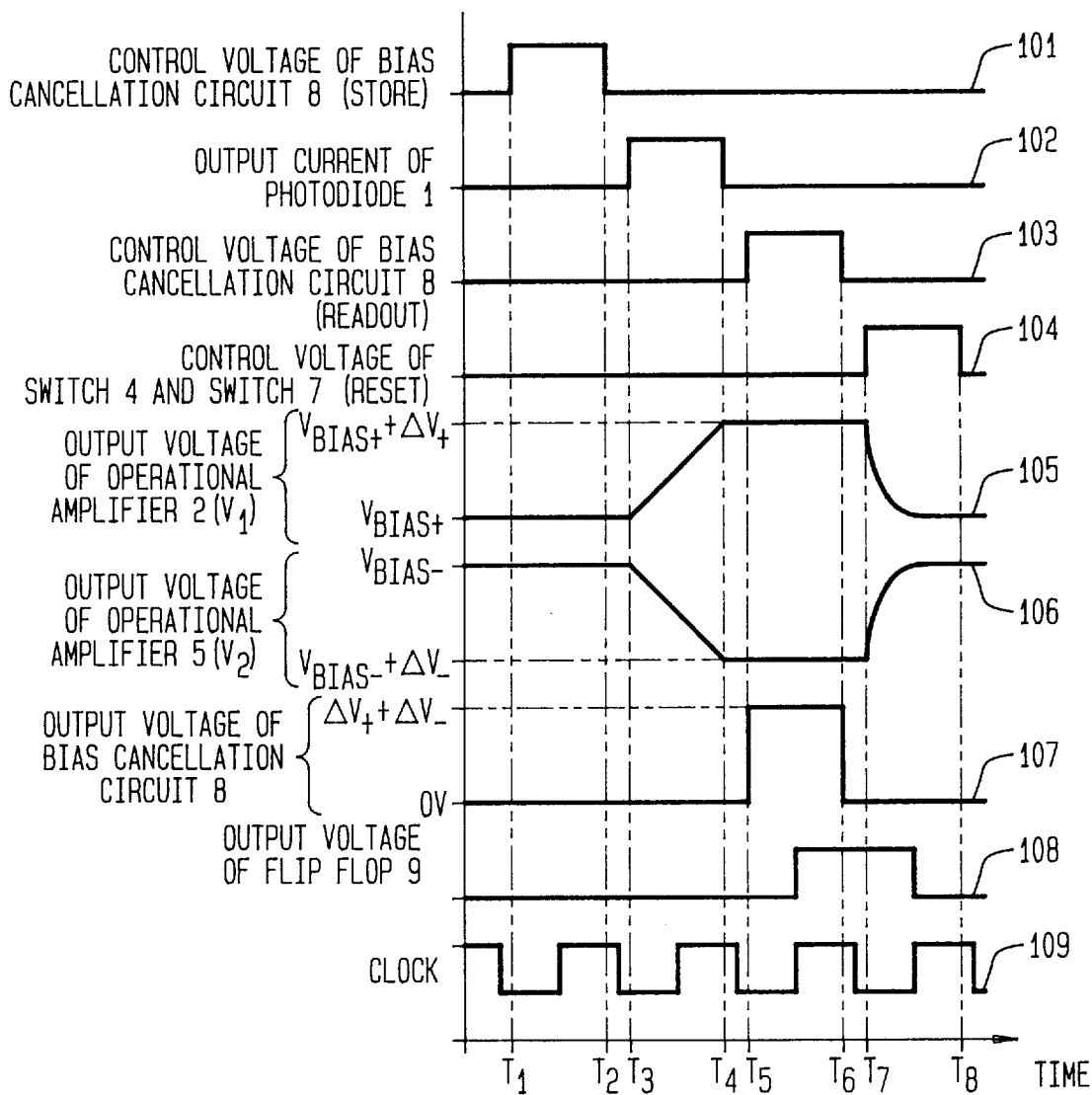
FIG. 4 is a timing diagram describing the operation of the optical receiver shown in FIG. 3.

A time-domain description of the operation of the circuit of FIG. 3 is shown in FIG. 4. The STORE signal 101, READOUT signal 103, and RESET signal 104 may be generated from the CLOCK signal 109 with a simple finite state machine. Construction of such a finite state machine is well known to those of ordinary skill in the art, and is taught in L.A. Glasser and D. W. Dobberpuhl, *The Design and Analysis of VLSI Circuits*, Addison Wesley, 1985, Chapter 6, which is hereby incorporated by reference. Initially, at t=0, the voltages across capacitor 3 and capacitor 6 are presumed to be zero, i.e. integrator 10 and integrator 11 have zero initial conditions. Thus, if operational amplifier 2 is presumed to have high gain, then both inputs and the output 15 voltage $V_1$ of operational amplifier 2 will be at voltage $V_{bias+}$, and $V_1=V_{bias+}$. Likewise, if operational amplifier 5 is presumed to have high gain, then both inputs and the output 16 voltage $V_2$ of operational amplifier 5 will be at DC voltage $V_{bias-}$, and $V_2=V_{bias-}$. During time interval $[T_1,T_2]$, the STORE control signal 101 to the bias cancellation circuit 8 is asserted, thus storing the initial values of $V_1$ and $V_2$ (biasing voltages) internally within the bias cancellation circuit. This operation will henceforth be referred to as the "store" operation.

During the time interval $[T_3,T_4]$, the photocurrent 102 from the photodiode 1 is at a constant high value, corresponding to a binary "1". During this interval, due to the constant input to the integrator 10, the $V_1$ voltage waveform 105 at the output of operational amplifier 2 integrates with a constant rising slope, and the $V_1$ voltage waveform 106 at the output of operational amplifier 5 integrates with a constant falling slope. At time $t=T_4$, $V_1$, reaches its final value of $V_{bias+}+\Delta V_+$, and $V_2$ reaches its final value of $V_{bias-}-\Delta V-$. This operation will henceforth be referred to as the "integrate" operation.

During the time interval $[T_5, T_6]$, READOUT signal 103 to the bias cancellation circuit 8 is asserted. During this interval, the bias cancellation circuit 8 subtracts the final value of $V_1$ from the initial value of $V_1$, and also subtracts the final value of $V_2$ from the initial value of $V_2$ The magnitudes of these subtractions are then added together at the output of the bias cancellation circuit 8 to form the final net output voltage $\Delta V_++\Delta V-$. This voltage 107 is fed to the input of the flip flop 9, which is clocked by the rising edge of the CLOCK signal 109. The output signal 108 of the flip flop 9 is presumed to be at a standard digital logic level (e.g. TTL or ECL). The circuit operation during the interval $[T_5, T_6]$ will henceforth be referred to as the "readout" operation.

During the time interval $[T_7, T_8]$ the RESET signal 104 to switch 4 and switch 7 is asserted. This causes the voltages across integration capacitor 3 and integration capacitor 6 to both be reset to zero due to the closing of switch 4 and switch 7. This function serves to reset integrator 10 and integrator 11 to zero initial conditions in preparation for reception for the next bit from photodiode 1. This operation will henceforth be referred to as the "reset" operation.

Figure 5:
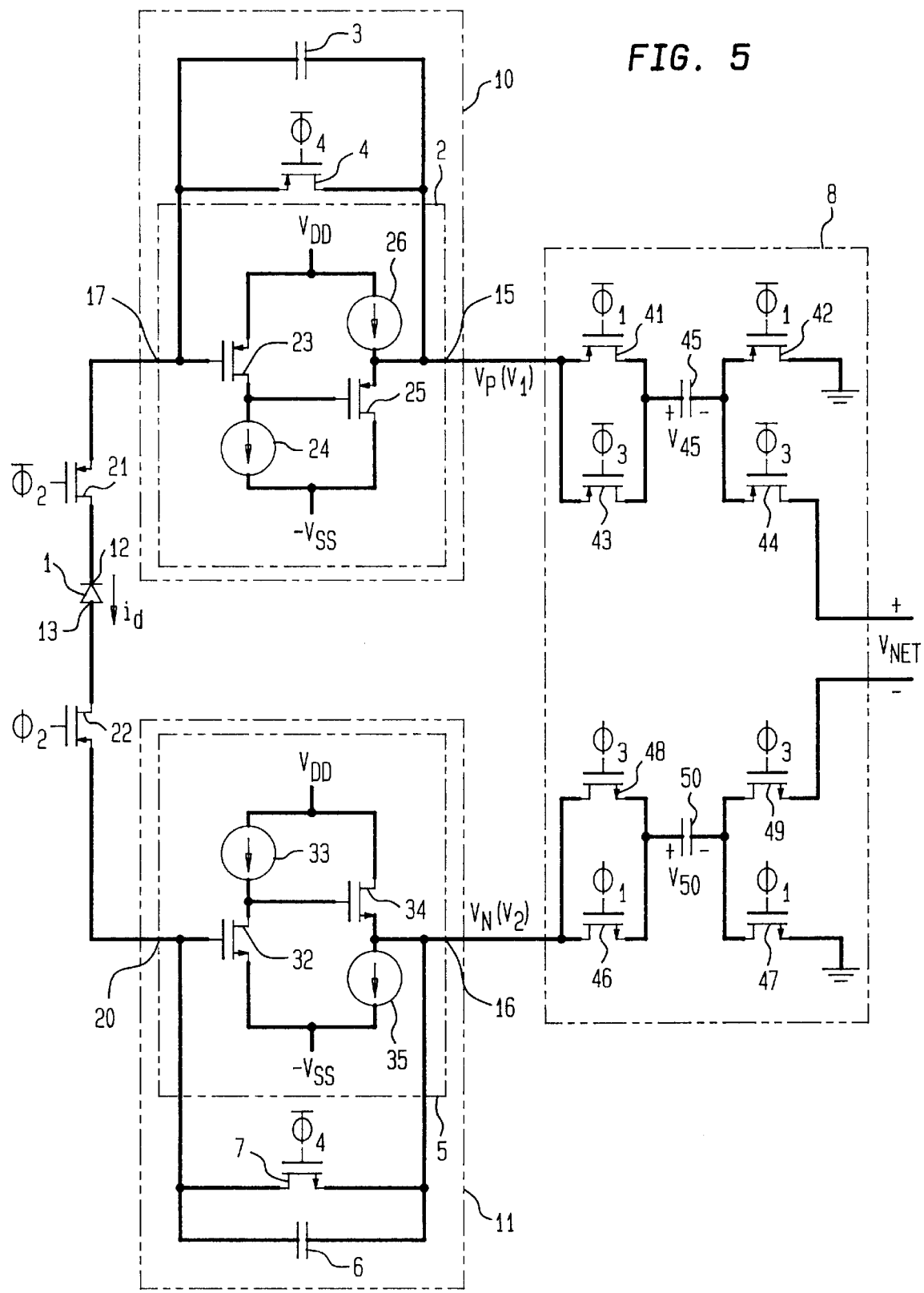
FIG. 5 is a more detailed schematic of the circuit of FIG. 3.

FIG. 5 shows an implementation of the optical receiver of FIG. 3. The gate of N-channel MOSFET 32 forms the input 20 of operational amplifier 5. The source of MOSFET 32 is connected to the negative power supply $-V_{ss}$, while the drain of MOSFET 32 is connected to current source 33. The combination of MOSFET 32 and current source 33 form a common-source amplifier. The drain of MOSFET 32 is also connected to the gate of N-channel MOSFET 34. The drain of MOSFET 34 is connected to the positive power supply $V_{DD}$, while the source of MOSFET 34 is connected to current source 35. MOSFET 34 and current source 35 form a source-follower amplifier. The source of MOSFET 34 serves as the output 16 of operational amplifier 5.

FIG. 5 depicts operational amplifier 5 as only having a single input terminal 20 instead of the differential input terminals 19 and 20 shown in FIG. 3. This is because operational amplifier 5 is implemented as a single-ended amplifier using N-channel MOSFET transistors. Operational amplifier 5 will have an implicit DC bias voltage at the input 20 which is equivalent to the $V_{bias-}$ bias voltage depicted in FIG. 3. Thus, the non-inverting input 19 of operational amplifier 5 is omitted from FIG. 5 for clarity.

In a similar fashion but with opposite types of transistors, the gate of P-channel MOSFET 23 forms the input 17 of the operational amplifier 2. MOSFET 23 and current source 24 form a common-source amplifier. MOSFET 25 and current source 26 form a source-follower amplifier. The source of MOSFET 25 serves as the output 15 of operational amplifier 2. Because operational amplifier 2 is constructed from P-channel transistors, it will have an implicit DC bias voltage at the input 17 which is equivalent to the $V_{bias+}$ bias voltage depicted in FIG. 3, and the non-inverting input 18 of operational amplifier 2 is omitted from FIG. 5 for clarity.

Capacitor 6 serves as an integration capacitor for operational amplifier 5. N-channel MOSFET 7 serves as a reset switch for capacitor 6. The opening and closing of switch MOSFET 7 is controlled by digital signal $\phi_4$. The combination of operational amplifier 5, capacitor 6, and MOSFET 7 form integrator 11.

Likewise, capacitor 3 serves as an integration capacitor for operational amplifier 2, and the P-channel MOSFET 4 serves as a reset switch for capacitor 3. The opening and closing of switch MOSFET 4 is controlled by digital signal $\bar{\phi}_4$. The combination of operational amplifier 2, capacitor 3, and MOSFET 4 form integrator 10.

The cathode 12 of photodiode I is connected to the gate of MOSFET 23 via P-channel switch MOSFET 21. The opening and closing of switch MOSFET 21 is controlled by digital signal $\bar{\phi}_2$. The anode 13 of photodiode 1 is connected to the gate of MOSFET 32 via N-channel switch MOSFET 22. The opening and closing of switch MOSFET 22 is controlled by digital signal $\phi_2$.

Bias cancellation circuit 8 consists of two capacitors 45 and 50, four P-channel switch MOSFETs 41–44, and four N-channel switch MOSFETs 46–49. Switch MOSFET 46 and switch MOSFET 47 are connected in series with capacitor 50 between the output 16 of operational amplifier 5 and ground. Switch MOSFET 46 and switch MOSFET 47 are controlled by digital signal $\phi_1$. Switch MOSFET 48 and switch MOSFET 49 are connected in series with capacitor 50 between the output 16 of operational amplifier 5 and the negative output of the bias cancellation circuit 8. Switch MOSFET 48 and switch MOSFET 49 are controlled by digital signal $\phi_3$.

Likewise, switch MOSFET 41 and switch MOSFET 42 are connected in series with capacitor 45 between the output 15 of operational amplifier 2 and ground, and are controlled by digital signal $\bar{\phi}_1$. Switch MOSFET 43 and switch MOSFET 44 are connected in series with capacitor 45 between the output of operational amplifier 2 and the positive output of bias cancellation circuit 8, and are controlled by digital signal $\bar{\phi}_3$.

Flip flop 9 is omitted from FIG. 5 for clarity, but is presumed to have the function of converting the analog output $V_{NET}$ of the bias cancellation circuit 8 into a standard digital signal (e.g. TTL or ECL) as described in FIG. 4.

Figure 6:
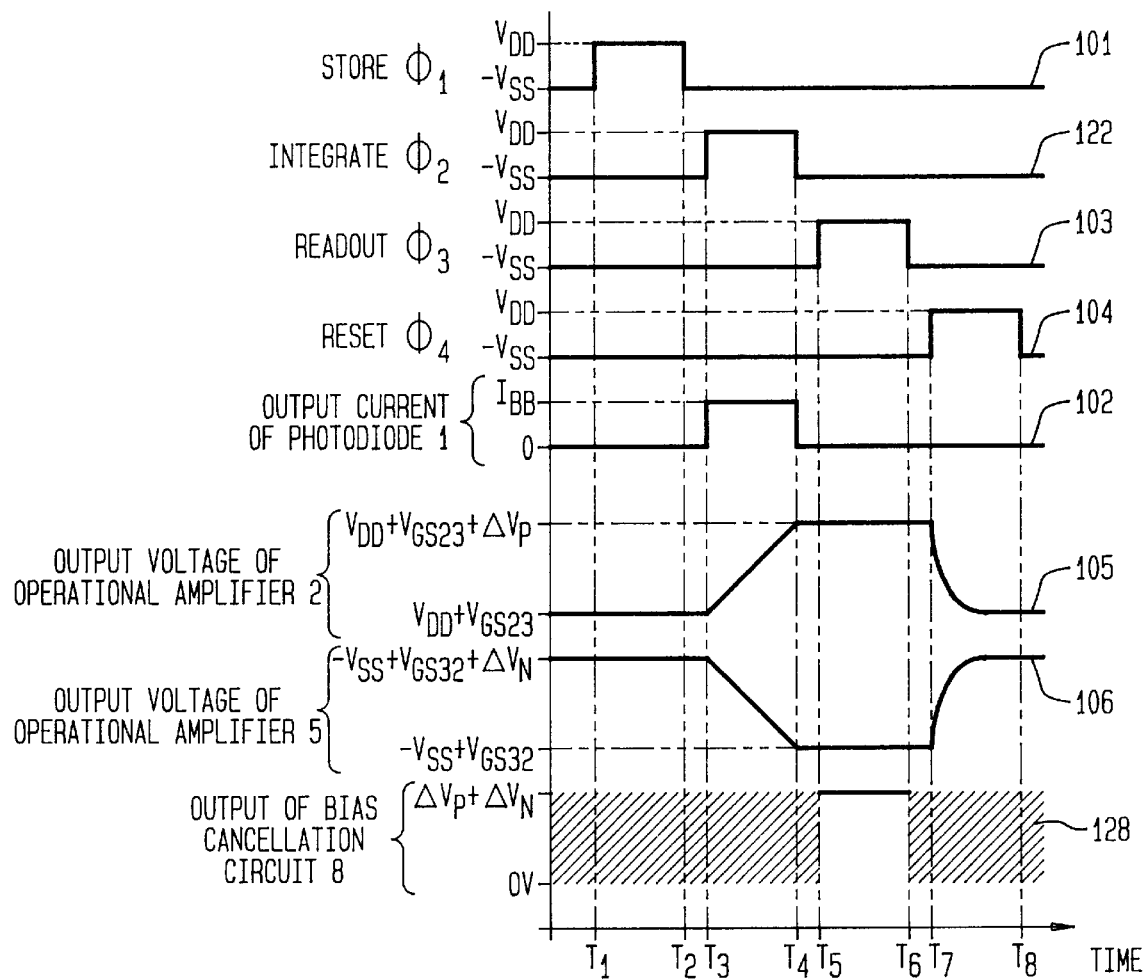
FIG. 6 is the timing diagram for the circuit of FIG. 5.

FIG. 6 shows a time description of the circuit of FIG. 5. The $\phi_1$ signal 101, $\phi_2$ signal 122, $\phi_3$ signal 103, and $\phi_4$ signal 104 are non-overlapping sequential fourphase clocks which switch from the two voltage supplies $-V_{SS}$ and $V_{DD}$ and which may be generated by a finite state machine. In addition, four complementary clocks $\bar{\phi}_1$, $\bar{\phi}_2$, $\bar{\phi}_3$, and $\bar{\phi}_4$, (not shown) are generated which swing from $V_{DD}$ to $-V_{SS}$. Initially at time t=0, the gate voltage of MOSFET 32 will have a value of $-V_{SS}+V_{GS32}$ where $V_{GS32}$ is the gate-source voltage of the N-channel MOSFET device 32. Likewise, the gate voltage of MOSFET 23 will have a value of $V_{DD}+V_{GS23}$, where $V_{GS23}$ is the gate-source voltage of the P-channel MOSFET device 23. The voltages across capacitor 6 and capacitor 3 are initially zero, and thus the output voltage $V_N$ of operational amplifier 5 is initially $V_N=-V_{SS}+V_{GS23}$ and the output voltage $V_P$ of operational amplifier 2 is initially $V_P=V_{DD}+V_{GS23}$.

The $\phi_1$ clock phase performs the "store" operation. During the time interval $[T_1,T_2]$, the $\phi_1$ clock signal 101 is held at the high value of $V_{DD}$, causing switch MOSFET 46 and switch MOSFET 47 to close. Thus, a voltage of $V_{50}=-V_{SS}+V_{GS32}$ will appear across capacitor 50. In addition, $\bar{\phi}_1$, will cause switch MOSFET 41 and switch MOSFET 42 to close, and a voltage of $V_{45}=V_{DD}+V_{GS23}$ will appear across capacitor 45. At time $T_2$, switch MOSFETs 46, 47, 41, and 42 all open, and the voltages across capacitors 50 and 45 are held at their respective values, representing the initial value (bias voltage) at the output of the integrators.

The $\phi_2$ clock phase performs the "integrate" operation. During the time interval $[T_3,T_4]$, the $\phi_2$ clock signal 122 is held at the high value of $V_{DD}$, causing switch MOSFET 22 to close. In addition, $\bar{\phi}_2$ will cause switch MOSFET 21 to close. This action causes the photodiode 1 to be connected to the input terminals of operational amplifier 5 and operational amplifier 2. This places a bias voltage across the photodiode 1 which is equal to the difference between the gate voltage of MOSFET 23 and the gate voltage of MOSFET 32. Thus, the bias voltage across photodiode 1 will be $V_{DD}+V_{SS}+V_{GS23}-V_{GS32}$.

If the current $i_d$ 102 through photodiode 1 is presumed to have a constant value of $I_{BB}$ during the interval $[T_3,T_4]$ (corresponding to a binary "1"), then the integrator 11 output voltage $V_N$ waveform 106 will ramp down with a constant slope. The value of the slope in waveform 106 will depend on the magnitude of $I_{BB}$, the value $C_6$ of capacitor 6, and the gain $A_N$ of operational amplifier 5, and will have a value of $-I_{BB}/C_6(1+1/A_N))$. Thus, the value at time $t=T_4$ at the output of integrator 11 will be $V_{N,t=T4}=-V_{SS}+V_{GS32}-\Delta V_N$, where $\Delta V_N=(I_{BB}(T_4-T_3))/(C_6(1+1/A_N)$.

Likewise, the integrator 10 output voltage $V_P$ waveform 105 will ramp up with a constant slope. The value of the slope in waveform 105 will depend on the magnitude of $I_{BB}$, the value $C_3$ of capacitor 3, and the gain $A_P$ of operational amplifier 2, and will have a value of $I_{BB}/(C_3(1+1/A_P))$. Thus, the value at time $t=T_4$ at the output of integrator 10 will be $V_{P,t=T4}=V_{DD}+V_{GS23}+\Delta V_P$, where $\Delta V_P=(I_{BB}(T_4-T_3))/(C_3(1+1/A_P))$.

If the current $i_d$ through the photodiode 1 were zero during $\phi_2$ (corresponding to a received binary "0"), then the slopes of the waveforms 105 and 106 would be zero, and thus $\Delta V_N=\Delta V_P=0$.

The $\phi_3$ clock phase performs the "readout" operation. During the time interval $[T_5, T_6]$, the $\phi_3$ clock signal 103 is held at the high value of $V_{DD}$, causing switch MOSFET 48 and switch MOSFET 49 to close. The closing of these switches places capacitor 50 in series with the output of integrator 11, causing the stored value $V_{50}$ on capacitor 50 to be subtracted from $V_N$. Thus, the negative terminal $V_{NET-}$ of the output of the bias cancellation circuit 8 will have a voltage of $$V_{NET-} = V_{N,t=T_4} - V_{50} \quad (1)$$
$$= -V_{SS} + V_{GS32} - \Delta V_N - (-V_{SS} + V_{GS32}) \quad (2)$$
$$= -\Delta V_N \quad (3)$$

In a similar fashion, $\overline{\phi}_3$ will cause switch MOSFET 43 and switch MOSFET 44 to close, thereby placing capacitor 45 in series with the output of integrator 10. This causes the stored value $V_{45}$ on capacitor 45 to be subtracted from $V_P$, and thus the positive terminal $V_{OUT+}$ of the output of the bias cancellation circuit 8 will have a voltage of $$V_{NET+} = V_{P,t=T_4} - V_{45} \quad (4)$$
$$= V_{DD} + V_{GS32} + \Delta V_P - (V_{DD} + V_{GS23}) \quad (5)$$
$$= \Delta V_P \quad (6)$$

Thus, during the $\phi_3$ clock phase, the net output voltage $V_{NET}$ of the bias cancellation circuit 8 will be $$V_{NET} = V_{NET+} - V_{NET-} \quad (7)$$
$$= \Delta V_P + \Delta V_N \quad (8)$$

$V_{NET}$ is subsequently fed to a flip flop 9 (not shown) for conversion into standard digital logic levels. The two possible states for $V_{NET}$ would be $V_{NET} = \Delta V_P + \Delta V_N$ for a binary '1', or $V_{NET} = 0$ for a binary "0". It should be noted that the output of the bias cancellation circuit 8 is at an indeterminate voltage (cross-hatched portion of waveform 128) when $\phi_3$ is unasserted. This does not affect circuit operation.

The $\phi_4$ clock phase performs the "reset" operation. During the time interval $[T_7, T_8]$ the $\phi_4$ clock signal 104 is held at the high value of $V_{DD}$, causing switch MOSFET 7 to close. This causes the voltage across capacitor 6 to be reset to zero, as shown in waveform 106, and thus causes both the input and output of amplifier 5 to be reset identically to a voltage of $-V_{SS} + V_{GS32}$. Similarly, $\overline{\phi}_4$ will cause switch MOSFET 4 to close, which causes the voltage across capacitor 3 to be reset to zero, as shown in waveform 105. This causes both the input and output of amplifier 2 to be reset identically to a voltage of $V_{DD} + V_{GS23}$.

By repeating the clock signals $\phi_1$, $\phi_2$, $\phi_3$, and $\phi_4$ in the circuit of FIG. 5, a sequence of bits may be received in succession.

Figure 7:
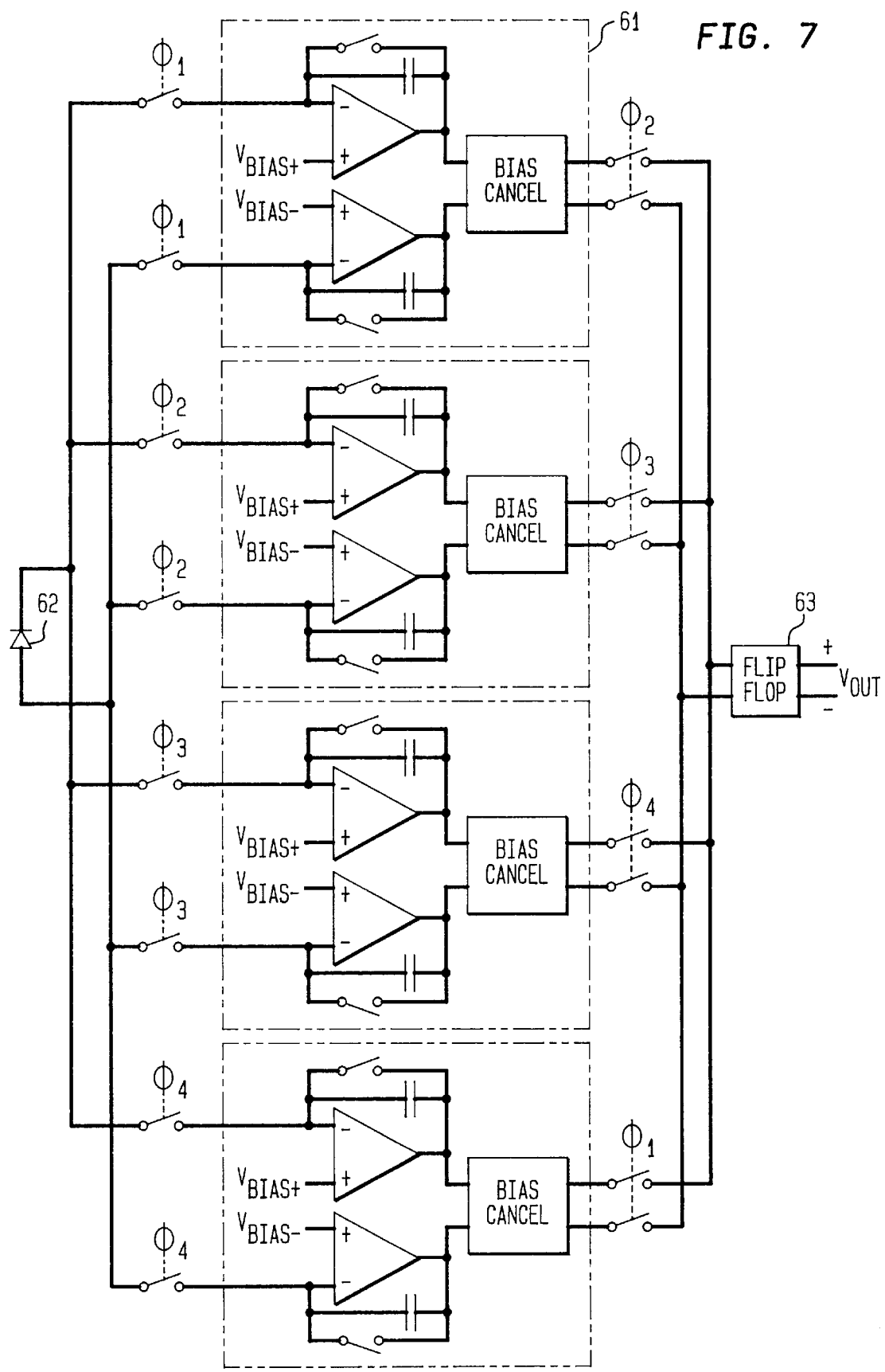
FIG. 7 is a circuit schematic showing four parallel optical receivers which perform dump, integration, bias cancellation, and readout simultaneously.

FIG. 7 shows the best mode of operation of the circuit illustrated in FIG. 3. The purpose of the four identical circuits 61 is to perform the "store,""integrate," "readout," and "reset" operations simultaneously. This is accomplished by having each circuit perform one of the four operations at any given instant in time, controlled by the non-overlapping sequential four-phase clocks $\phi_1$, $\phi_2$, $\phi_3$, and $\phi_4$. The photodiode 62 and the flip flop 63 are shared by the four circuits 61 via an arrangement of switches. The photodiode 62 is a PIN photodetector fabricated in any semiconductor technology (e.g. silicon or gallium arsenide). The photodiode 62 could also be implemented as an MSM (metal-semiconductor-metal) photodetector. The balance of the circuit, including all amplifiers, switches, and capacitors, is fabricated as a single monolithic integrated circuit using CMOS (complementary metal oxide semiconductor) technology. The capacitors may be implemented by overlapping two polysilicon layers in the CMOS fabrication process. The switches and amplifiers are fabricated with MOS transistors.

Having thus described our invention, what we claim as new and desire to secure by Letters Patents is:

1. An optical receiver, comprising:

only a single photodiode for converting incoming optical signals to electrical signals;

a plurality of first electronic amplifiers electronically connected to a first terminal of said photodiode, with said amplifiers biased at a preselected first potential;

a plurality of second electronic amplifiers electronically connected to a second terminal of said photodiode with said second amplifiers biased at a preselected second potential; and a plurality of pairs of output terminals, each of said pairs of output terminals being an output terminal of one of said first amplifiers and one of said second amplifiers, each said pair of output terminals having a signal voltage responsive to one of a plurality of optical input signals.

2. An optical receiver, as recited in claim 1, further comprising:

a plurality of switches; and means for generating clock signals for operating said switches so that a first number of said amplifiers are integrating simultaneously with a second number of said amplifiers which are dumping simultaneously with a third number of said amplifiers which are reading out respective signal voltages.

3. An optical receiver as recited in claim 1, wherein said first amplifiers are P-type common source input stages with the input terminals of said first amplifiers biased at a a preselected first potential, and wherein said second amplifiers with N-type common source input stages with the input terminals of said second amplifiers biased at a preselected potential where said converting means is biased as a result of being electronically connected directly to a parallel configuration of said first and second amplifiers, with the output of said receiver being a signal voltage responsive to said optical signal.

4. An optical receiver comprising:

a means for converting an incoming optical signal to an electrical signal;

an electronic first amplifier electronically connected to a first terminal of said converting means for amplification of said electronic signal, with said first amplifier constructed with a P-type common source input stage such that the input terminal of said first amplifier is biased at a preselected first potential; and an electronic second amplifier electronically connected to a second terminal of said converting means for amplification of said electronic signal, with said second amplifier constructed with an N-type common source input stage such that the input terminal of said second amplifier is biased at a preselected second potential where said converting means is biased as a result of being electronically connected directly to said first and second amplifier, with the output of said receiver being a signal voltage responsive to said optical signal.

* * * * *